（12） United States Patent
Magajna

(10) Patent No.: US 8,456,251 B2
(45) Date of Patent: Jun. 4, 2013

(54) PHASE-CONTROLLED OSCILLATOR

(75) Inventor: Patrick Magajna, Longjumeau (FR)

(73) Assignee: Patrick Magajna, Longjumeau (FR)

( * ) Notice: Subject to any disclaimer, the term of this patent is extended or adjusted under 35 U.S.C. 154(b) by 0 days.

(21) Appl. No.: 13/239,561

(22) Filed: Sep. 22, 2011

(65) Prior Publication Data

US 2012/0249248 A1     Oct. 4, 2012

(30) Foreign Application Priority Data

Sep. 24, 2010   (FR) ..................................... 10 57709

(51) Int. Cl.
*H03B 5/20*     (2006.01)

(52) U.S. Cl.
USPC .............. 331/135; 331/45; 327/237; 327/238

(58) Field of Classification Search
USPC .............................. 331/135, 57; 327/237, 238
See application file for complete search history.

(56) References Cited

U.S. PATENT DOCUMENTS

| 4,286,235 | A | 8/1981 | Wilber et al. |
| 4,600,899 | A | 7/1986 | Kennedy |
| 4,808,936 | A | 2/1989 | Lamb |
| 4,871,984 | A | 10/1989 | Laton et al. |
| 6,690,243 | B1 | 2/2004 | Henrion |
| 6,937,107 | B2 * | 8/2005 | Ravi et al. ........................ 331/47 |

* cited by examiner

*Primary Examiner* — Arnold Kinkead
(74) *Attorney, Agent, or Firm* — Greer, Burns & Crain, Ltd.

(57) ABSTRACT

An adjustable-frequency oscillator, is formed by two looped systems, functioning at the same frequency but the signals are phase shifted by 90°. Each looped system includes a phase shift device, an active element providing the gain and a resonator having a fixed phase-frequency characteristic. As the phase shift in each loop is imperatively a whole multiple of $2\pi$, the phase shift added in each loop by the phase shift device entails that each resonator introduces a complementary phase shift to comply with the oscillation criterion. This complementary phase shift is produced at a frequency defined by the resonator, this then defining the frequency of oscillation. The frequency is adjusted by two phase shift stages, which carry out the analogue multiplication of the signals coming from the two looped systems by control voltages and the summing of these products.

13 Claims, 6 Drawing Sheets

PRINCIPAL
LOOPED SYSTEM

SECONDARY
LOOPED SYSTEM

PHASE-CONTROLLED OSCILLATOR

BACKGROUND

The present application relates to an oscillator making it possible to generate an adjustable-frequency electric signal.

The field of the invention is the field of electronic circuits and, in particular, of integrated electronic circuits used in the radiofrequency and microwave frequency fields, for example in communication systems.

In the radiofrequency and microwave frequency fields, the most used method for obtaining an adjustable-frequency oscillator consists of modifying the phase-frequency characteristic of the resonator.

In particular, oscillators can be mentioned which are designed around one or more varactors (or voltage-controlled variable capacitors).

This type of component does not however generally allow a frequency variation greater than one octave. Moreover, if it is desired to fully integrate the oscillator, the technology used during the design of the integrated circuit most often complies with choices which are not optimized, in order to obtain a maximum variation of the value of the capacitance of the varactor. The variable capacitor does not therefore make it possible to obtain a frequency variation over a wide frequency band or it must be located outside of the integrated circuit.

Moreover, the introduction of variable components in the resonator creates losses, which reduces the quality factor of the loaded resonator.

SUMMARY

A purpose of the present invention is to overcome the above-mentioned drawbacks.

Another purpose of the invention is to propose an oscillator making it possible to obtain a frequency variation range which is wider than that of currently existing oscillators.

Another purpose of the invention is to propose an oscillator which makes it possible to obtain a variable-frequency signal and which improves the noise characteristic.

Finally, another purpose of the invention is to propose an oscillator which can be fully integrated.

In order to achieve at least one of these objectives, the invention proposes an oscillator for generating an adjustable-frequency signal, said oscillator comprising a looped system, called principal, said principal looped system comprising:
  a phase shift device, called principal, comprising at least one phase shift stage, called principal, for shifting the phase of a signal, called principal, by an adjustable phase shift value, said principal signal being a cosine signal or a sine signal,
  at least one means for adjusting the phase shift produced by said phase shift device, and
  a resonator, called principal, the input of which is connected to the output of said principal phase shift device and the output of which is connected to the input of said principal phase shift device,
said principal looped system providing a signal the frequency of which depends on said phase shift value.

In order for oscillations to be established in the oscillator, one of the criteria defined by theory entails the existence in the looped system of a phase shift which is a whole multiple of $2\pi$. As the phase shift device imposes an adjustable phase shift in the looped system, the resonator therefore introduces a complementary phase shift such that the sum of these two phase shifts is a whole multiple of $2\pi$. The complementary phase shift introduced by the resonator therefore defines the oscillation frequency, by the intermediary of the phase-frequency characteristic of that resonator.

Thus, the invention proposes an oscillator providing a signal the frequency of which is adjusted by a phase shift. The oscillator according to the invention therefore makes it possible to carry out an adjustment/variation of the frequency without modifying the phase-frequency characteristic of the resonator used, in particular without modifying the value of a component element of the oscillator, such as for example a capacitive element and or an inductive element.

The frequency of the signal provided/generated by the oscillator according to the invention is directly adjusted by the phase shift applied by the phase shift device.

The oscillator according to the invention can be capable of complete integration.

Moreover, the oscillator does not comprise any capacitive element the value of which can be modified.

Moreover, the range of variation of the frequency is directly dependent on the range of variation of the phase shift value. For example, a range of variation of the phase shift value of 180° or of 360° makes it possible to obtain, with the oscillator according to the invention, a range of variation of the frequency greater than that obtained with presently existing oscillators.

The use of a phase shift device combined with a resonator makes it possible to obtain a variable-frequency signal with less noise.

Advantageously, the principal phase shift device can comprise several phase shift stages, connected in series, each phase shift stage defining a level of phase shift.

The use of several phase shift stages makes it possible, by making use of phase shift stages having a small phase shift range or small phase shift ranges, to obtain a large "overall" phase shift range for the principal phase shift device and thus to have a large range of variation of the frequency of the output signal of the oscillator.

The use of several phase shift stages also makes it possible to obtain several independent means for adjusting the phase shift.

In the present application, the verb "connect" denotes a direct or indirect connection between two elements.

Advantageously, the at least one means of adjusting the phase shift produced by said phase shift device can comprise:
  at least one means of adjustment common to all the phase shift stages, each of said phase shift stages producing an identical phase shift, or
  at least one means of adjustment associated with each phase shift stage and making it possible to adjust the phase shift produced by each phase shift stage independently, or
  at least one means of adjustment common to several phase shift stages, producing an identical phase shift for these phase shift stages, the other phase shift stages being adjusted by other means of adjustment.

According to a particularly advantageous embodiment that is in no way limitative, the at least one phase shift means can be reduced to a line entering one or more phase shift stages and provided for conveying a phase shift control signal, generated by a means outside of the oscillator, this control signal causing the phase shift in the phase shift stage or stages to vary. In this case, the control signal can be a control voltage.

According to a particular embodiment, at least one phase shift stage can comprise:
  a first multiplier providing a first signal corresponding to the product of the principal signal and a first control voltage, a second multiplier providing a second signal, corresponding to the product of a so-called secondary signal and:
- a second control voltage when said principal signal is a sine, said secondary signal corresponding to the principal signal advanced by a value of 90°, or
- a third control voltage when said principal signal is a cosine, said secondary signal corresponding to the principal signal delayed by a value of 90°;

an adder for adding said first and second signals provided by said multipliers;

said first, second and third control voltages corresponding respectively to the cosine, sine and −sine of the adjustable phase shift value multiplied by the same constant.

Such a phase shift stage makes it possible to phase-shift the principal signal by an adjustable phase shift value.

Thus, in this particularly advantageous embodiment of the oscillator according to the invention, the phase shift of a signal is produced by analogue multiplication of this signal by control voltages, according to the following trigonometric equations:

$$\cos(\omega t)*\cos(a)+\sin(\omega t)*(-\sin(a))=\cos(\omega t+a),\text{ when the signal the frequency of which is adjusted is a cosine and}$$

$$\sin(\omega t)*\cos(a)+\cos(\omega t)*\sin(a)=\sin(\omega t+a),\text{ when the signal the frequency of which is adjusted is a sine}$$

where $\omega$ is the angular frequency of the signal generated.

In this embodiment, the control voltages can be:
- identical for all the phase shift stages: in this case all the phase shift stages produce a phase shift of the same value, or
- different for each phase shift stage: in this case, each phase shift stage produces a phase shift of a value different from that of the other phase shift stages.

In this embodiment, the control voltages directly modify the phase of the signal within the looped system.

When the principal looped system comprises several phase shift stages, as each of the phase shift stages defines a level of phase shift, each phase shift stage receives as input a principal signal and a secondary signal and provides the phase-shifted principal signal. This phase-shifted principal signal becomes the principal signal for the following stage.

In a particular embodiment, the secondary signal can be obtained from the incoming principal signal of each phase shift stage. In order to do this, the oscillator according to the invention comprises, upstream of each principal phase shift stage of a given level, a constant phase-shifter, the phase-frequency characteristic of which exhibits a phase shift which is constant with respect to frequency and generating the secondary signal for said principal phase shift stage from the principal signal.

When the principal signal is a cosine, the constant phase-shifter provides a sine of the same amplitude and of the same frequency as the principal signal. In the case where the principal signal is a sine, the constant phase-shifter provides a cosine of the same amplitude and of the same frequency as the principal signal.

In another embodiment, the secondary signal can be obtained from a second looped system, called secondary. Thus, the oscillator according to the invention can comprise a second looped system, called secondary, said secondary looped system comprising:
- a second phase shift device, called secondary, comprising as many so-called secondary phase shift stages, connected in series, as there are principal phase shift stages, the output of the principal resonator being connected to an input of said secondary phase shift device,
- a second resonator, called secondary, the input of which is connected to the output of said secondary phase shift device and the output of which is connected to an input of said secondary phase shift device and to an input of said principal phase shift device;

a secondary phase shift stage of a given level producing the same phase shift as that of the principal phase shift stage of the same level and the output of a phase shift stage of a given level being connected to an input of the principal phase shift stage of the following level, said secondary phase shift stage of said level providing the secondary signal to said principal phase shift stage of said following level.

The function of the secondary looped system is to provide the secondary signal to each phase shift stage. In order to do this, the secondary looped system comprises as many phase shift stages as there are in the principal looped system, i.e. as many phase shift levels as there are in the principal looped system. Each secondary phase shift stage produces a phase shift of the same value as the phase shift produced by a principal phase shift stage of the same level and provides the secondary signal to the principal phase shift stage of the following level. The secondary signal used by the principal phase shift stage of the first level of phase shift is obtained at the output of the resonator of the secondary looped system.

In a particular embodiment of the secondary looped system:
- the output of a principal phase shift stage of a given level of phase shift is connected to an input of the secondary phase shift stage of the level following and
- each secondary phase shift stage comprises:
  - a third multiplier providing a signal corresponding to the product of the secondary signal and the first control voltage,
  - a fourth multiplier providing a signal corresponding to the product:
    - of the principal signal and the second control voltage when said signal is a cosine,
    - of the principal signal and the third control voltage when said signal is a sine,
  - an adder for adding the signals provided by said third and fourth multipliers and for providing said secondary signal.

Thus, each secondary phase shift stage uses the principal signal in order to obtain the secondary signal by analogue multiplication with control voltages. The control voltages used by the principal and secondary phase shift stages of the same level produce a phase shift of the same value. The secondary signal is obtained according to the following trigonometric equations carried out by each of the secondary phase shift stages:

$$\cos(\omega t)*\cos(a)+\sin(\omega t)*(-\sin(a))=\cos(\omega t+a),\text{ when the signal the frequency of which is adjusted, i.e. the principal signal, is a sine and}$$

$$\sin(\omega t)*\cos(a)+\cos(\omega t)*\sin(a)=\sin(\omega t+a),\text{ when the signal the frequency of which is adjusted, i.e. the principal signal, is a cosine.}$$

where $\omega$ is the angular frequency.

In this embodiment, the output of each resonator (principal and secondary) is connected to an input of each first level phase shift stage (principal and secondary) and the output of each phase shift stage (principal and secondary) of a given level of phase shift is connected to an input of each phase shift stage (principal and secondary) of the level following.

According to an embodiment of a phase shift stage, at least one multiplier of a phase shift stage can comprise:

a switching circuit comprising four transistors connected two by two as differential pairs and controlled by the control voltages, an amplifier circuit comprising two transistors connected as a differential pair.

Moreover, two multipliers of two phase shift stages of the same level of phase shift and receiving the same signals can comprise:

a switching circuit each, each switching circuit comprising four transistors connected two by two as differential pairs, and an amplifier circuit common to the two multipliers and comprising two transistors connected as a differential pair.

Moreover, two multipliers of two phase shift stages of a same level of phase shift and receiving different signals can comprise:

an amplifier circuit each, each amplifier circuit comprising four transistors connected two by two as differential pairs, and a common switching circuit comprising two transistors connected as a differential pair.

The fact of placing an amplification circuit or a switching circuit in common for two multipliers makes it possible to reduce the number of components and therefore to reduce the manufacturing cost and the dimensions of the oscillator.

The oscillator according to the invention can also comprise a power divider, arranged upstream of each phase shift stage.

The oscillator according to the invention can also comprise at least one amplifier arranged in each looped system, more particularly at the input of each phase shift device.

In a particular embodiment, at least one resonator can be a transmission line, the phase-frequency characteristic of which is linear or non-linear.

Advantageously, the oscillator according to the invention can be produced using integrated circuit technology.

The oscillator according to the invention is particularly suitable for use in the radiofrequency or microwave frequency field or in the optical field in order to obtain an adjustable-frequency signal.

BRIEF DESCRIPTION OF THE DRAWINGS

Other advantages and characteristics of the invention will become apparent on examination of the detailed description of an embodiment which is in no way limitative, and the attached diagrams, in which.

DETAILED DESCRIPTION

Figure 1:
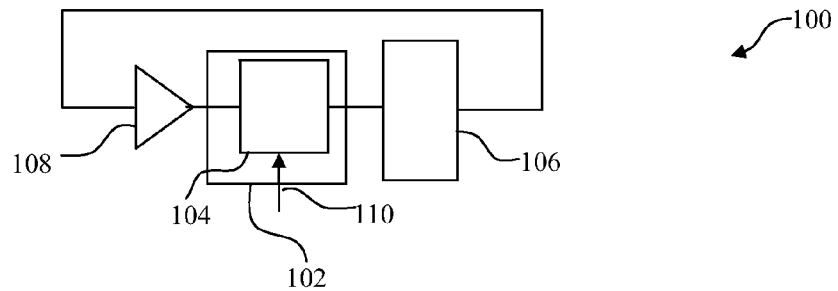
FIG. 1 is a diagrammatic representation of a first embodiment of an oscillator according to the invention.

FIG. 1 is a diagrammatic representation of a first embodiment of an oscillator according to the invention.

The oscillator 100 shown in FIG. 1 is a very simplified version of an oscillator according to the invention. In fact, the oscillator 100 is essentially a looped system comprising a phase shift device 102 consisting of an adjustable phase shifter 104, a resonator 106 arranged downstream of the phase shifter 104 and an amplifier 108 arranged upstream of the phase shifter 104. The output of the resonator 106 is connected directly to the input of the amplifier 108.

The oscillator 100 comprises moreover means for adjusting the phase shift produced by the phase shifter 104. In the example shown in FIG. 1, these means comprise a control line, represented by the arrow 110. The control line 110 makes it possible to adjust the phase shift produced by the phase shifter 104 by a control voltage for example.

The resonator 106 can be, but is not limited to, a transmission line the phase-frequency characteristic of which is linear.

Figure 2:
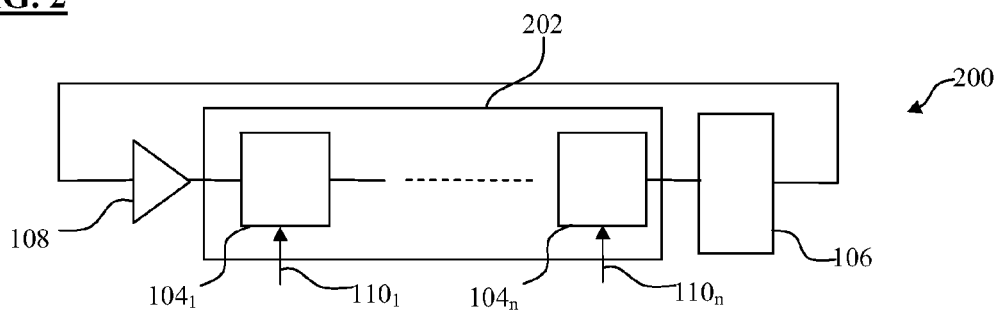
FIG. 2 is a diagrammatic representation of a second embodiment of an oscillator according to the invention.

FIG. 2 is a diagrammatic representation of a second embodiment of an oscillator according to the invention.

The oscillator 200 is a looped system comprising a phase shift device 202 comprising a plurality of adjustable phase shifters $104_1$-$104_n$ connected in series, a resonator 106 arranged downstream of the phase shift device 202 and an amplifier 108 arranged upstream of the phase shift device 202. The output of the resonator 106 is connected directly to the input of the amplifier 108.

The oscillator 200 comprises moreover means for adjusting the phase shift produced by each phase shifter 104. In the example shown in FIG. 2, these means comprise a control line for each phase shifter, represented by the arrows $110_1$, $110_n$. The control lines $110_1$-$110_n$ make it possible to adjust the phase shift produced by each phase shifter, $104_1$-$104_n$ respectively, by a control voltage for example. The control voltage can either be identical for all or for a portion of the phase shifters $104_1$-$104_n$ such that the phase shift applied by a portion or by all of the phase shifters $104_1$-$104_n$ is identical, or different for each phase shifter $104_1$-$104_n$ such that the phase shift applied by each phase shifter $104_1$-$104_n$ can be different and can be adjusted individually and independently of the other phase shifters.

Each phase shifter $104_1$-$104_n$ defines a level of phase shift. Thus, the phase shifter $104_1$ corresponds to the first level of phase shift, the phase shifter $104_n$ corresponds to the phase shift of level n. The looped system of the oscillator 200 therefore comprises n levels of phase shift, where n is a positive integer.

Figure 3:
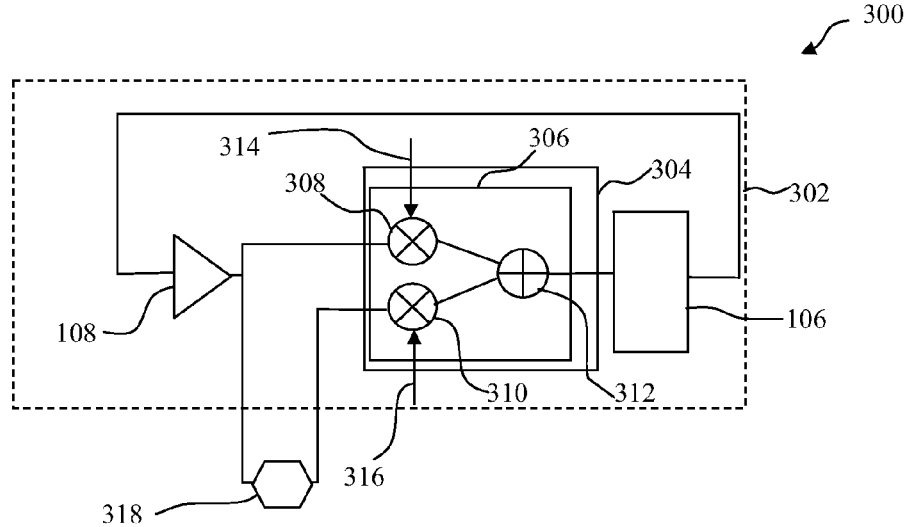
FIG. 3 is a diagrammatic representation of a third embodiment of an oscillator according to the invention.

FIG. 3 is a diagrammatic representation of a third embodiment of an oscillator according to the invention.

The oscillator 300 comprises a looped system 302.

The looped system 302 comprises a phase shift device 304 comprising a phase shift stage 306, an amplifier 108 arranged upstream of the phase shift device 304 and a resonator 106 arranged downstream of the phase shift device 304.

The phase shift stage 306 comprises a first multiplier 308 providing a first signal corresponding to the product of the signal to be phase-shifted, hereinafter called the "principal signal" and a first control voltage. The phase-shift stage 306 comprises a second multiplier 310 providing a second signal, corresponding to the product of a signal, called the secondary signal, and:

a second control voltage when the principal signal is a sine, the secondary signal corresponding to the principal signal advanced by a value of 90°, or a third control voltage when the principal signal is a cosine, the secondary signal corresponding to the principal signal delayed by a value of 90°;

the first, second and third control voltages corresponding respectively to the cosine, sine and −sine of the adjustable phase shift value multiplied by the same constant.

The phase shift stage 306 comprises moreover an adder 312 arranged downstream of the multipliers 308 and 310 and adding the signals provided by the multipliers 308 and 310.

The first control voltage is provided to the phase shift stage 306 and more particularly to the multiplier 308 by a control line represented by the arrow 314.

The second or the third control voltage is provided to the phase shift stage 306 and more particularly to the multiplier 310 by a control line represented by the arrow 316.

The oscillator 300 also comprises a constant phase shifter, the phase-frequency characteristic of which exhibits a phase shift which is constant with respect to frequency, 318, arranged between the amplifier 108 and the phase shift stage 306 and providing the secondary signal from the principal signal. The phase shifter 318 is provided for:

delaying the principal by 90° when the principal signal is a cosine and advancing the principal signal by 90° when the principal signal is a sine.

The sum of the signals thus obtained at the output of the adder 312 corresponds to the principal signal shifted by the phase shift value according to the following equations:

$$\cos(\omega t)*\cos(a)+\sin(\omega t)*(-\sin(a))=\cos(\omega t+a), \text{ when the principal signal is a cosine and}$$

$$\sin(\omega t)*\cos(a)+\cos(\omega t)*\sin(a)=\sin(\omega t+a), \text{ when the principal signal is a sine}$$

"a" being the adjustable phase shift value and ω being the angular frequency of the generated signal.

Figure 4:
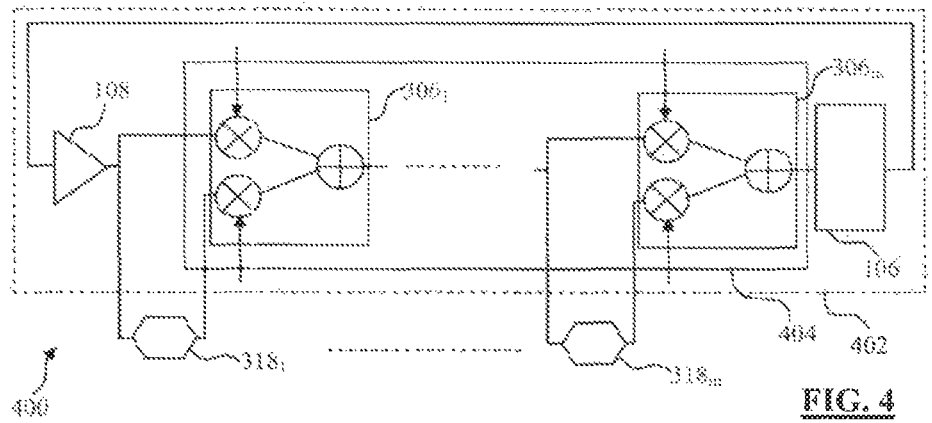
FIG. 4 is a diagrammatic representation of a fourth embodiment of an oscillator according to the invention.

FIG. 4 is a diagrammatic representation of a fourth embodiment of an oscillator according to the invention.

The oscillator 400 comprises a looped system 402.

The looped system 402 comprises a phase shift device 404 comprising a plurality of phase shift stages $306_1$-$306_m$ connected in series and each defining a level of phase shift, an amplifier 108 dispose upstream of the phase shift device 404 and a resonator 106 arranged downstream of the phase shift device 404.

Each phase shift stage $306_1$-$306_m$ of the phase shift device 404 is identical to the phase shift stage 306 of FIG. 3. Each phase shift stage $306_1$-$306_m$ is provided for producing a phase shift on the principal signal provided by the preceding phase shift stage by analogue multiplication with control voltages. The control voltages can be:

identical for all or a portion of the phase shift stages $306_1$-$306_m$: in this case, these phase shift stages produce the same phase shift on the principal signal, or different for each phase shift stage $306_1$-$306_m$: in this case, each phase shift stage $306_1$-$306_m$ produces a different phase shift of the principal signal.

According to the chosen configuration, the control voltages can be adjusted independently for each phase shift stage $306_1$-$306_m$ or in a way which is common to all or a portion of the phase shift stages $306_1$-$306_m$.

The oscillator 400 also comprises a constant phase shifter, $318_1$-$318_m$ for each phase shift stage $306_1$-$306_m$, arranged upstream of each phase shift stage $306_1$-$306_m$ and providing the secondary signal to the phase shift stage 306 of a given phase shift level from the principal signal received from the phase shift stage of the preceding level of phase shift. Each constant phase shifter $318_1$-$318_m$ is identical to the constant phase shifter 318 in FIG. 3.

Figure 5:
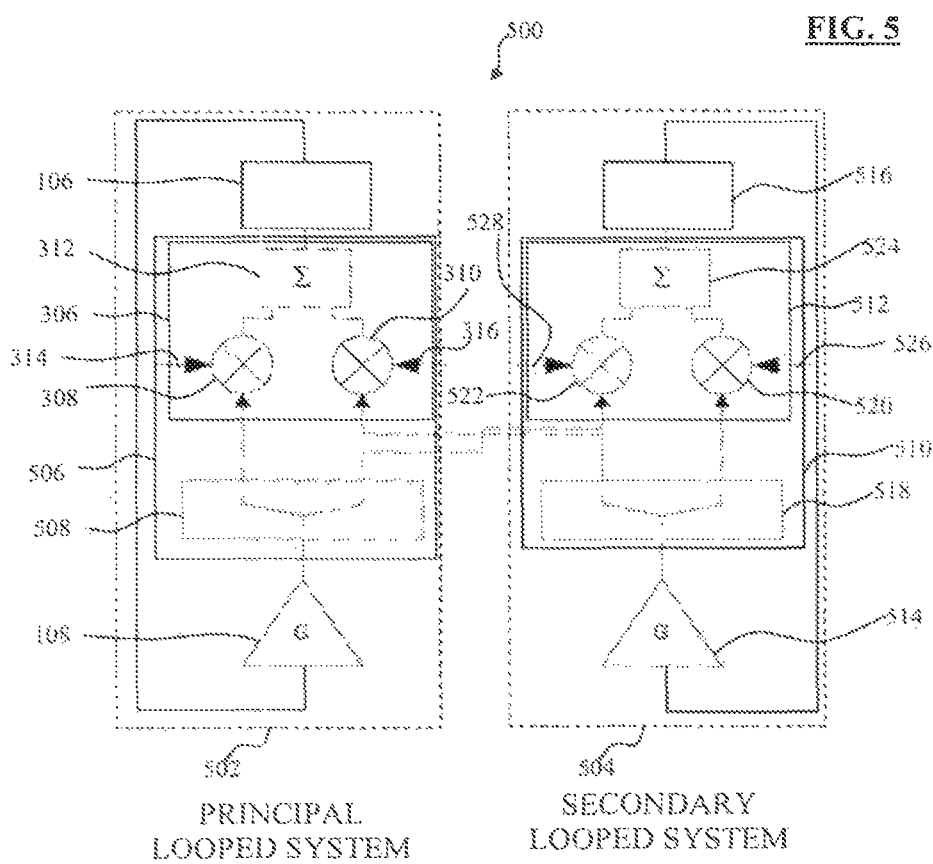
FIG. 5 is a diagrammatic representation of a fifth embodiment of an oscillator according to the invention.

FIG. 5 is a diagrammatic representation of a fifth embodiment of an oscillator according to the invention.

The oscillator 500 in FIG. 5 comprises a first looped system 502, called the principal looped system and a second looped system 504, called the secondary looped system.

The principal looped system 502 comprises an amplifier 108, a resonator 106 and a principal phase shift device 506 comprising a phase shift stage 306 identical to the phase shift stage 306 shown in FIG. 3. A power divider 508 is arranged between the amplifier 108 and the phase shift stage 306. In the continuation of the description the phase shift stage or stages of the principal phase shift device 506 will be called principal phase shift stage(s).

The function of the secondary looped system 504 is to provide the secondary signal used by the principal phase shift stage 306 of the principal looped system 502. In order to do this, the secondary looped system 504 comprises a phase shift device 510, called secondary, comprising a phase shift stage 512, called secondary, supplying the secondary signal by analogue multiplication with control voltages, an amplifier 514 arranged upstream of the secondary phase shift stage 512 and a resonator 516 arranged downstream of the secondary phase shift stage 512. The output of the resonator 516 is connected to the input of the amplifier 514.

A power divider 518 is arranged between the amplifier 514 and the secondary phase shift stage 512.

The secondary phase shift stage 512 is identical to the principal phase shift stage 306 and comprises:

a multiplier 520 providing a signal corresponding to the product of the secondary signal and the first control voltage, a multiplier 522 providing a signal corresponding to the product:

of the principal signal and the second control voltage when said signal is a cosine, of the principal signal and the third control voltage when said signal is a sine, an adder 524 for adding the signals provided by the multipliers 520 and 522 and providing the secondary signal.

The first control voltage is provided to the secondary phase shift stage 512 by a control line represented by the arrow 526. The second or the third control voltage is provided to the secondary phase shift stage 512 by a control line represented by the arrow 528.

The first, second and third control voltages used by the principal phase shift stage 306 and the secondary phase shift stage 512 are identical. Thus, the phase shift stages 306 and 512 apply the same phase shift to the principal signal and to the secondary signal respectively.

The sum of the signals thus obtained at the output of the adder 524 corresponds to the secondary signal shifted by the phase shift value applied to the principal signal by the principal phase shift stage 306:

$$\cos(\omega t)*\cos(a)+\sin(\omega t)*(-\sin(a))=\cos(\omega t+a), \text{ when the principal signal is a sine and}$$

$$\sin(\omega t)*\cos(a)+\cos(\omega t)*\sin(a)=\sin(\omega t+a), \text{ when the principal signal is a cosine.}$$

where "a" is the phase shift value and ω is the angular frequency of the generated signal.

The principal signal and the secondary signal are each divided into two by the power dividers 508 and 518 respectively and provided to each of the principal 306 and secondary 512 phase shift stages.

The principal and secondary looped systems provide two signals in quadrature.

Figure 6:
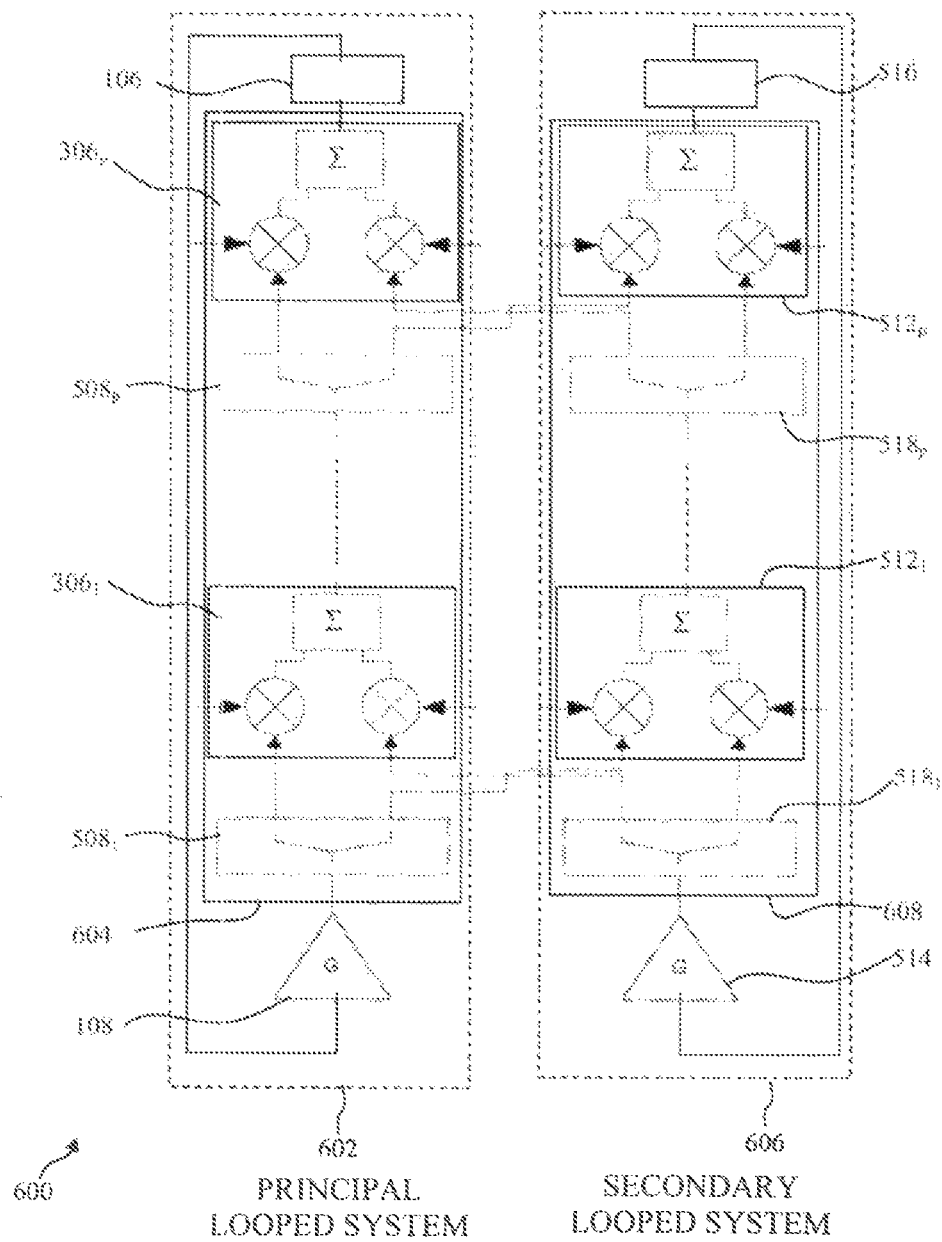
FIG. 6 is a diagrammatic representation of a sixth embodiment of an oscillator according to the invention.

FIG. 6 is a diagrammatic representation of a sixth embodiment of an oscillator according to the invention.

The oscillator 600 shown in FIG. 6 comprises a principal looped system 602 comprising an amplifier 108, a resonator 106 and a principal phase shift device 604 comprising a plurality of principal phase shift stages $306_1$-$306_p$, connected in series and identical to the phase shift stage 306 in FIG. 3. Each principal phase shift $306_1$-$306_p$ defines a level of phase shift.

The oscillator 600 also comprises a secondary looped system 606 comprising an amplifier 514, a resonator 516 and a secondary phase shift device 608 comprising as many secondary phase shift stages $512_1$-$512_p$, connected in series and identical to the secondary phase shift stage 512 in FIG. 5, as there are principal phase shift stages $306_1$-$306_p$, each phase shift stage $512_1$-$512_p$ defining a level of phase shift. Each secondary phase shift stage $512_1$-$512_p$ of a given phase shift level produces a phase shift of value identical to that of the phase shift produced by the principal phase shift stage $306_1$-$306_p$ of the same level of phase shift.

Before each principal phase shift stage $306_1$-$306_p$ is arranged a power divider $508_1$-$508_p$, dividing the principal signal coming from the preceding level of phase shift in order to inject it into the principal phase shift stage and the secondary phase shift stage of the following level.

Before each secondary phase shift stage $512_1$-$512_p$, is arranged a power divider $518_1$-$518_p$, dividing the secondary signal coming from the preceding level of phase shift in order to inject it into the principal phase shift stage and the secondary phase shift stage of the following level.

Figure 7:
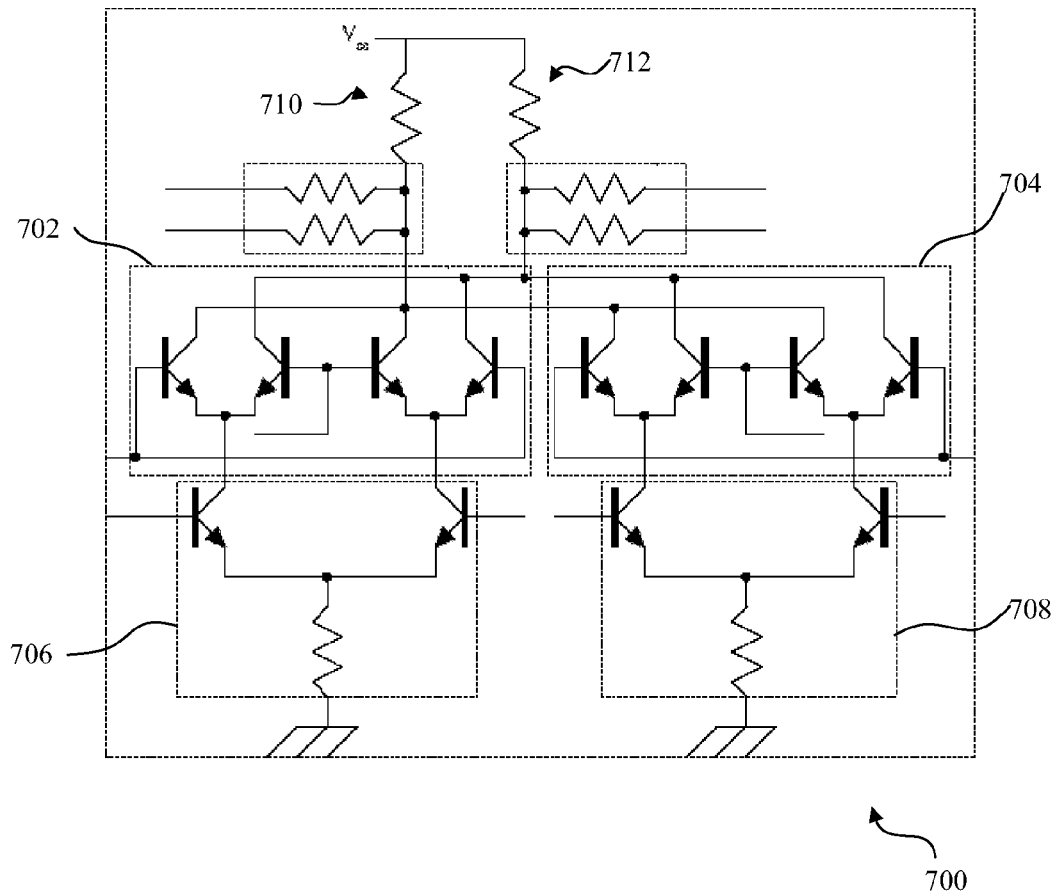
FIG. 7 is a diagrammatic representation of a phase shift stage capable of use in the embodiments shown in FIGS. 3 to 6.

FIG. 7 is a diagrammatic representation of a phase shift stage capable of use in the embodiments shown in FIGS. 3 to 6 as a principal phase shift stage or as a secondary phase shift stage.

The phase shift stage 700 comprises, for each multiplier of the phase shift stage, a switching circuit 702 and 704, each comprising four transistors connected two by two as differential pairs and controlled by the control voltages. Each multiplier also comprises an amplifier circuit 706 and 708 comprising two transistors connected as a differential pair and coupled with the switching circuits, 702 and 704 respectively. The resistors 710 and 712 inserted between the power supply line $V_{cc}$ and the collectors of the transistors carry out the operation of summing the signals and more particularly the addition of the currents.

When two multipliers of two phase shift stages of the same level use the same signals, a more compact architecture can be proposed for producing these two multipliers.

Figure 8:
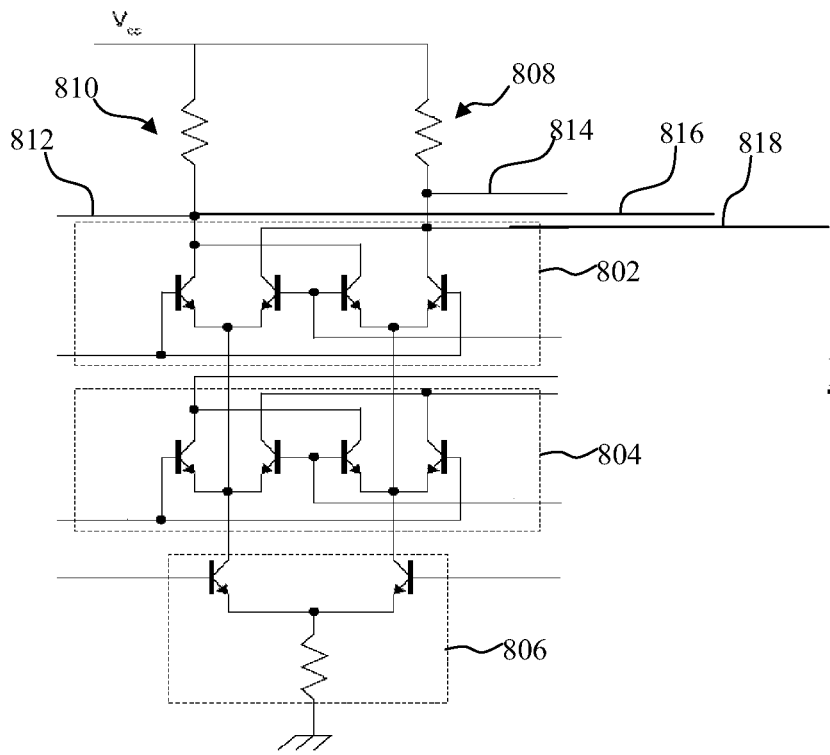
FIGS. 8 and 9 are diagrammatic representations of two architectures of phase shift stages that are more compact, capable of use in the embodiments shown in FIGS. 5 and 6.

Thus, FIG. 8 is a diagrammatic representation of such an architecture capable of use in the embodiments shown in FIGS. 5 and 6.

Each of the two multipliers of two phase shift stages of the same level receiving the same signals comprise a switching circuit 802 and 804, each switching circuit 802 and 804 comprising four transistors connected two by two as differential pairs and controlled by the control voltages. According to the architecture proposed in FIG. 8, a common amplifier circuit 806 is associated with the two switching circuits 802 and 804, this amplifier circuit 806 comprising two transistors connected as a differential pair. The resistors 808 and 810 inserted between the power supply line $V_{cc}$ and the collectors of the transistors carry out the operation of summing the signals and more particularly the addition of the currents.

In the architecture shown in FIG. 8, connections make it possible, on the one hand, to convey, in the resistors 808 and 810, the currents coming from the other multiplier of the same phase shift stage and, on the other hand, to convey the voltages resulting from the summing of the signals in the resistors 808 and 810 either to the multipliers of the level of phase shift following, or to the resonator or resonators.

Thus, two transmission lines 812 and 814 each constitute a connection with the phase shift stages of the level of phase shift following or the resonator and convey either the principal signal or the secondary signal.

Two other transmission lines 816 and 818 each convey the signal obtained at the output of a multiplier and which is to be summed with the signal obtained at the output of the other multiplier of the same phase shift stage.

When two multipliers of two phase shift stages of the same level use different signals, a more compact architecture can also be proposed for producing these two multipliers.

Figure 9:
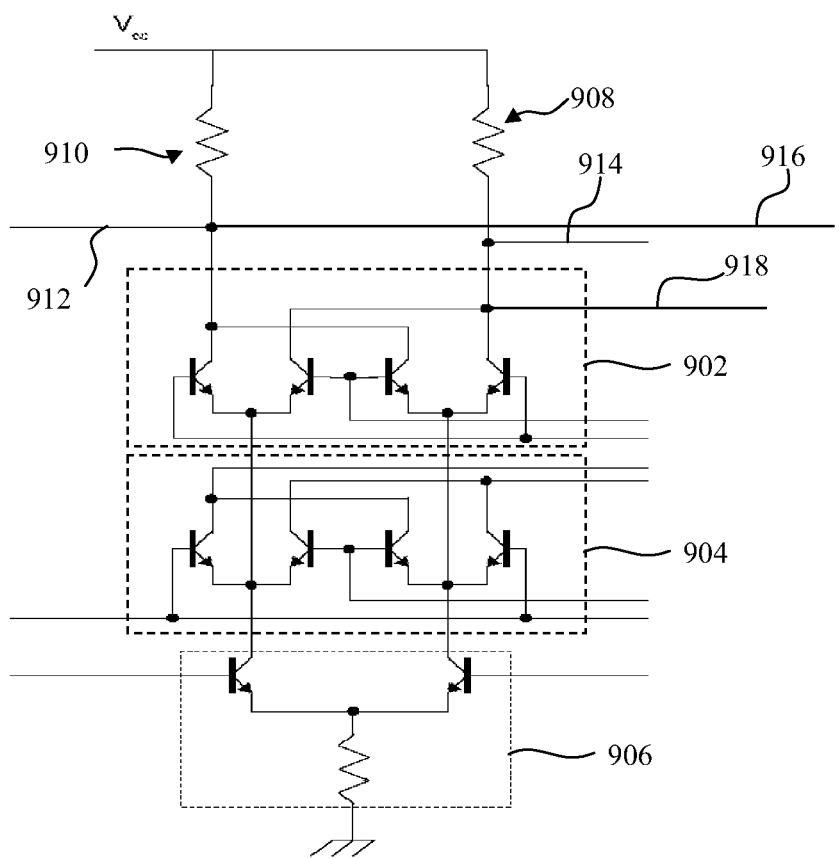

Thus, FIG. 9 is a diagrammatic representation of such an architecture capable of use in the embodiments in FIGS. 5 and 6.

Each of the two multipliers of two phase shift stages of the same level receiving different signals comprise an amplification circuit 902 and 904, each amplification circuit 902 and 904 comprising four transistors connected two by two as differential pairs, the bases of which are connected to a resonator or to the outputs of the phase shift stages of the preceding level of phase shift. According to the architecture proposed in FIG. 9, a common switching circuit 906 is associated with the two amplification circuits 902 and 904, this switching circuit 906 comprising two transistors connected as a differential pair.

The resistors 908 and 910 inserted between the power supply line $V_{cc}$ and the collectors of the transistors carry out the operation of summing the signals and more particularly the addition of the currents.

In the architecture shown in FIG. 9, connections make it possible, on the one hand, to convey, in the resistors 908 and 910, the currents coming from the other multiplier of the same phase shift stage and, on the other hand, to convey the voltages resulting from the summing of the signals in the resistors 908 and 910, either to multipliers of the following level of phase shift, or to the resonator or resonators.

Thus, two transmission lines 912 and 914 each constitute a connection with the phase shift stages of the following level of phase shift or with the resonator and convey either the principal signal or the secondary signal.

Two other transmission lines 916 and 918 each convey the signal obtained at the output of a multiplier and which is to be summed with the signal obtained at the output of the other multiplier of the same phase shift stage.

Figure 10:
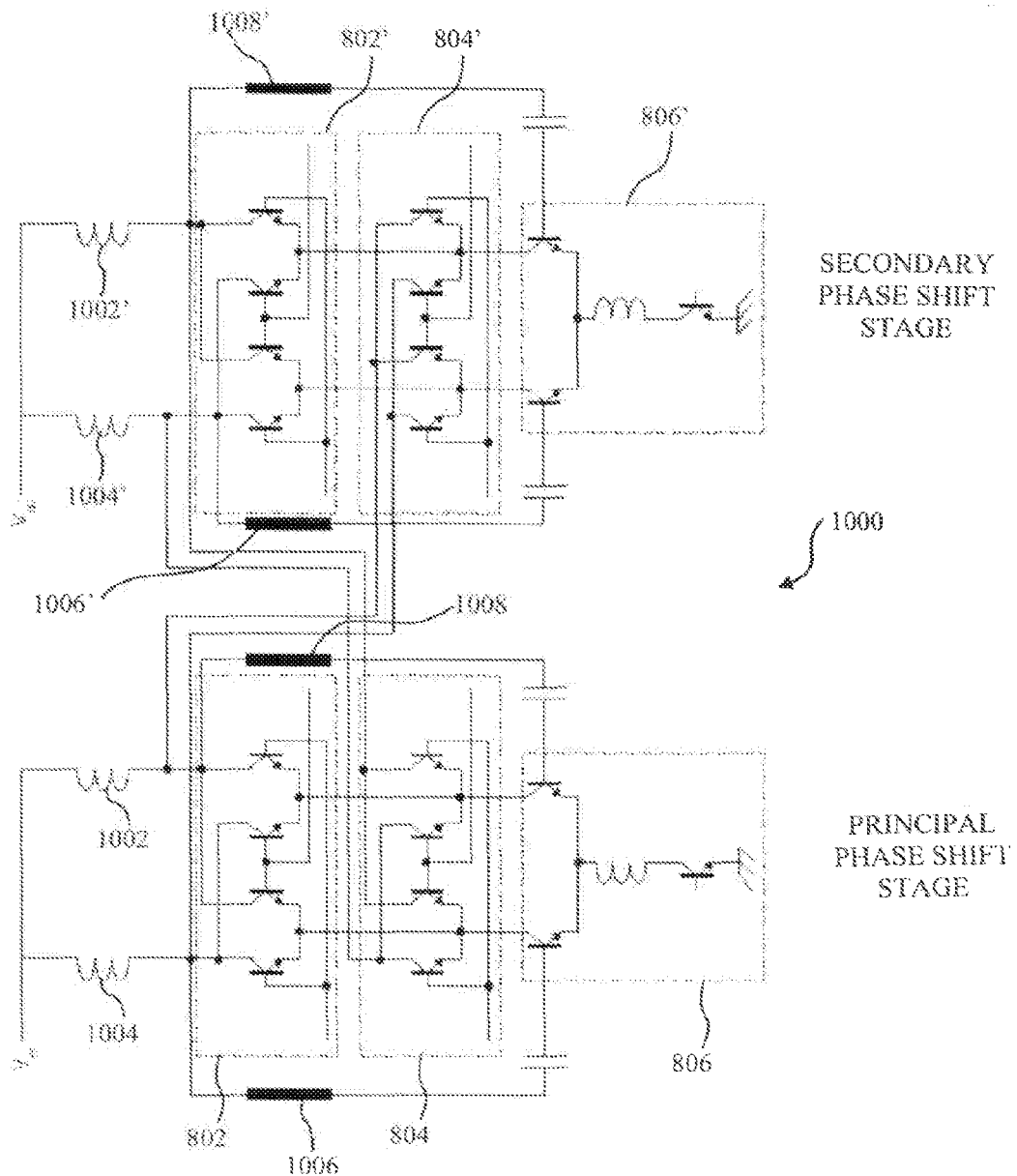
FIG. 10 is a diagrammatic representation of a preferred embodiment of an oscillator according to the invention.

FIG. 10 is a representation of a preferred embodiment of an oscillator according to the invention using the compact architecture described with reference to FIG. 8.

The oscillator 1000 shown in FIG. 10 comprises a single level of phase shift comprising two phase shift stages, namely a principal phase shift stage and a secondary phase shift stage.

The resistors 808 and 810 of a phase shift stage are replaced by inductances. Thus, the oscillator 1000 comprises two inductances 1002 and 1004 for the principal shift stage and 1002' and 1004' for the secondary phase shift stage.

The oscillator 1000 comprises moreover two switching circuits per phase shift stage, namely the switching circuits 802 and 804 for the principal phase shift stage and the switching circuits 802' and 804' for the secondary phase shift stage.

Each phase shift stage comprises an amplifier circuit, namely the amplifier circuit 806 for the principal phase shift stage and the amplifier circuit 806' for the secondary phase shift stage. The resistor of each amplifier circuit is also replaced by an inductance.

Resonators 1006 and 1008, which are transmission lines, make it possible to loop back the signal coming from the principal phase shift stage to the input of the principal phase shift stage.

Similarly, resonators 1006' and 1008', which are transmission lines, make it possible to loop back the signal coming from the secondary phase shift stage to the input of the secondary phase shift stage.

In the examples described, it is also possible to replace at least one of the resistors 710, 712, 908 and 910, by an impedance, having a non-zero imaginary part. These impedances can correspond at least partly to all or part of the resonator.

Of course, the invention is not limited to the examples which have just been described and numerous adjustments can be made to these examples without exceeding the scope of the invention.

The invention claimed is:

1. An oscillator for generating an adjustable-frequency signal, said oscillator comprising:
    a principal looped system comprising:
        a principal phase shift device including an input and an output and comprising at least one principal phase shift stage for shifting the phase of a principal signal by an adjustable phase shift value, each principal phase shift stage defining a level of phase shift, said principal signal being a cosine or a sine,
        a principal resonator including a principal resonator input and a principal resonator output, the principal resonator input being connected to the output of said principal phase shift device and the principal resonator output being connected to an input of said principal phase shift device;
    a secondary looped system comprising:
        a secondary phase shift device including an input and an output and comprising a plurality of secondary phase shift stages, connected in series, and
        a secondary resonator including a secondary resonator input and a secondary resonator output, the secondary resonator input being connected to the output of said secondary phase shift device and the secondary resonator output being connected to the input of said secondary phase shift device and to the input of said principal phase shift device, and the output of the principal resonator being connected to the input of said secondary phase shift device,
    said oscillator comprising at least one means for adjusting the phase shift produced by each of said principal and secondary phase shift stages by multiplication of two signals in quadrature by two control signals and by summing;
    wherein for each principal or secondary phase shift stage of one of said principal or secondary looped systems:
        one of said signals in quadrature is the principal signal, and
        the other of said signals in quadrature is the secondary signal.

2. The oscillator according to claim 1, wherein the at least one means for adjusting the phase shift comprises:
    at least one means of adjustment common to all the principal and secondary phase shift stages, each of said phase shift stages producing an identical phase shift, or
    at least one means of adjustment associated with each of said principal and secondary phase shift stages and making it possible to adjust the phase shift produced by each phase shift stage independently, or
    at least one means of adjustment common to several phase shift stages of said principal and secondary phase shift stages, producing an identical phase shift for these phase shift stages, the other phase shift stages being adjusted by other means of adjustment.

3. The oscillator according to claim 1, wherein that a secondary phase shift stage of a given level produces the same phase shift as that of the principal phase shift stage of the same level and the output of a secondary phase shift stage of a given level is connected to an input of the principal phase shift stage of the level following, said secondary phase shift stage of said given level providing the secondary signal to said principal phase shift stage of said following level, the output of a principal phase shift stage of a given level is connected to an input of the secondary phase shift stage of the level following, said principal phase shift stage of said given level providing the principal signal to said secondary phase shift stage of said following level.

4. The oscillator according to claim 1, characterized in that at least one principal phase shift stage comprises:
    a first multiplier providing a first signal corresponding to a multiplication of the principal signal and a first control voltage,
    a second multiplier providing a second signal, corresponding to a multiplication of the secondary signal, and:
        a second control voltage when said principal signal is a sine, said secondary signal corresponding to the principal signal advanced by a value of 90°, or
        a third control voltage when said principal signal is a cosine, said secondary signal corresponding to the principal signal delayed by a value of 90°
        an adder for adding said first and second signals provided by said multipliers;
    said first, second and third control voltages corresponding respectively to the cosine, sine and −sine of the adjustable phase shift value multiplied by the same constant.

5. The oscillator according to claim 4, wherein:
    at least one principal phase shift stage of a given level of phase shift is connected to an input of the secondary phase shift stage of the following level,
    each secondary phase shift stage comprising:
        a third multiplier providing a signal corresponding to the product of the secondary signal and the first control voltage,
        a fourth multiplier providing a signal corresponding to the multiplication:
            of the principal signal and the second control voltage when said signal is a cosine,
            of the principal signal and the third control voltage when said signal is a sine,
        an adder for adding the signals provided by said third and fourth multipliers and providing said secondary signal.

6. The oscillator according to claim 4, wherein at least one multiplier of one of said principal and secondary phase shift stage comprises:
    a switching circuit comprising four transistors connected two by two as differential pairs and controlled by the control voltages,
    an amplifier circuit comprising two transistors connected as a differential pair.

7. The oscillator according to claim 6, wherein two multipliers of two phase shift stages of the same level of phase shift and receiving the same signals comprise:
   a switching circuit, each switching circuit comprising four transistors connected two by two as differential pairs, and
   a common amplifier circuit comprising two transistors connected as a differential pair.

8. The oscillator according to claim 6, wherein two multipliers of two phase shift stages of the same level of phase shift and receiving different signals different comprise:
   an amplifier circuit each, each amplifier circuit comprising four transistors connected two by two as differential pairs and
   a common switching circuit comprising two transistors connected as a differential pair.

9. The oscillator according to claim 1, wherein a power divider is arranged upstream of each phase shift stage.

10. The oscillator according to claim 1, further comprising at least one amplifier arranged in each of said principal and secondary looped systems.

11. The oscillator according to claim 1, wherein at least one of said principal and secondary resonators comprises a transmission line.

12. The oscillator according to claim 1, wherein said oscillator is produced using integrated circuit technology.

13. Use of the oscillator according to claim 1 in the radiofrequency or microwave frequency field or in the optical field.

* * * * *